United States Patent
Matsuzawa

(10) Patent No.: US 8,359,747 B2
(45) Date of Patent: Jan. 29, 2013

(54) METHOD FOR MANUFACTURING LIQUID EJECTING HEAD

(75) Inventor: Akira Matsuzawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 767 days.

(21) Appl. No.: 11/927,955

(22) Filed: Oct. 30, 2007

(65) Prior Publication Data

US 2008/0127471 A1 Jun. 5, 2008

(30) Foreign Application Priority Data

Oct. 31, 2006 (JP) .............................. 2006-296677

(51) Int. Cl.
*B21D 53/76* (2006.01)
*H01L 41/22* (2006.01)
*H04R 17/00* (2006.01)
*B41J 2/015* (2006.01)

(52) U.S. Cl. .................. 29/890.1; 29/25.35; 347/20

(58) Field of Classification Search .............. 29/890.1, 29/25.35; 347/20, 40, 44, 65, 68–70; 310/311, 310/316.01, 317
See application file for complete search history.

(56) References Cited

U.S. PATENT DOCUMENTS

| | | | | |
|---|---|---|---|---|
| 4,480,259 A * | 10/1984 | Kruger et al. | ............... | 347/63 |
| 4,487,662 A * | 12/1984 | Fischbeck | ............... | 205/122 |
| 4,496,960 A * | 1/1985 | Fischbeck | ............... | 347/68 |
| 4,509,063 A * | 4/1985 | Sugitani et al. | ............... | 347/65 |
| 4,558,333 A * | 12/1985 | Sugitani et al. | ............... | 347/65 |
| 4,611,219 A * | 9/1986 | Sugitani et al. | ............... | 347/40 |
| 4,654,676 A * | 3/1987 | Itano et al. | ............... | 347/85 |
| 4,698,645 A * | 10/1987 | Inamoto | ............... | 347/65 |
| 4,723,129 A * | 2/1988 | Endo et al. | ............... | 347/56 |
| 4,839,001 A * | 6/1989 | Bakewell | ............... | 205/50 |
| 4,894,664 A * | 1/1990 | Tsung Pan | ............... | 347/63 |
| 5,148,185 A * | 9/1992 | Abe et al. | ............... | 347/65 |
| 5,262,802 A * | 11/1993 | Karita et al. | ............... | 347/87 |
| 5,278,585 A * | 1/1994 | Karz et al. | ............... | 347/65 |
| 5,389,957 A * | 2/1995 | Kimura et al. | ............... | 347/20 |
| 5,485,184 A * | 1/1996 | Nakagomi et al. | ............... | 347/63 |
| 6,074,543 A * | 6/2000 | Yoshihira et al. | ............... | 205/75 |
| 6,260,960 B1 * | 7/2001 | Hashizume et al. | ............... | 347/70 |
| 6,293,656 B1 * | 9/2001 | Okazaki et al. | ............... | 347/65 |
| 6,331,258 B1 * | 12/2001 | Silverbrook | ............... | 216/27 |
| 6,341,847 B1 * | 1/2002 | Ohta et al. | ............... | 347/54 |
| 6,398,348 B1 * | 6/2002 | Haluzak et al. | ............... | 347/63 |
| 6,435,669 B1 * | 8/2002 | Nakata et al. | ............... | 347/65 |
| 6,450,776 B1 * | 9/2002 | Taneya et al. | ............... | 417/207 |
| 6,464,345 B2 * | 10/2002 | Kubota et al. | ............... | 347/65 |

(Continued)

FOREIGN PATENT DOCUMENTS

| | | | |
|---|---|---|---|
| JP | 2003-159801 | * | 6/2003 |
| JP | 2006-044083 | * | 2/2006 |

*Primary Examiner* — David Angwin
(74) *Attorney, Agent, or Firm* — Maschoff Gilmore & Israelsen

(57) ABSTRACT

A method for manufacturing a liquid ejecting head that has a channel forming substrate and a reservoir forming substrate is provided. The method includes forming a vibration plate on the channel forming substrate, a piezoelectric element on the vibration plate removing portions of the vibration plate to form first and second opening portions, forming a lead electrode extending from the piezoelectric element including a first separate metal layer disposed over the first opening portion and a second separate layer disposed on the second opening portion, attaching a reservoir forming substrate to the channel forming substrate, forming a communicating portion in the channel forming substrate with a first positioning hole corresponding to the first opening portion and a second positioning hole corresponding to the second opening portion, and communicating the reservoir portion and the communicating portion by removing the separate metal layers.

9 Claims, 9 Drawing Sheets

U.S. PATENT DOCUMENTS

| | | | |
|---|---|---|---|
| 6,468,437 B1 * | 10/2002 | Kashino et al. | 216/27 |
| 6,497,475 B1 * | 12/2002 | Kubota et al. | 347/65 |
| 6,517,198 B2 * | 2/2003 | Yoshihira et al. | 347/87 |
| 6,533,400 B1 * | 3/2003 | Kudo et al. | 347/63 |
| 6,554,383 B2 * | 4/2003 | Nagatomo et al. | 347/9 |
| 6,652,076 B2 * | 11/2003 | Okazaki et al. | 347/56 |
| 6,719,408 B2 * | 4/2004 | Yoshihira et al. | 347/65 |
| 6,834,943 B2 * | 12/2004 | Ogawa et al. | 347/65 |
| 6,851,779 B2 * | 2/2005 | Okazaki et al. | 347/11 |
| 6,854,831 B2 * | 2/2005 | Kubota et al. | 347/65 |
| 6,945,635 B2 * | 9/2005 | Kubota et al. | 347/63 |
| 7,318,277 B2 * | 1/2008 | Torimoto et al. | 29/890.1 |
| 7,367,267 B2 * | 5/2008 | Silverbrook et al. | 101/487 |
| 7,547,094 B2 * | 6/2009 | Kawamura et al. | 347/50 |
| 7,581,495 B2 * | 9/2009 | Silverbrook et al. | 101/424.1 |
| 8,025,009 B2 * | 9/2011 | Silverbrook et al. | 101/424.1 |
| 8,037,603 B2 * | 10/2011 | Fujii et al. | 29/890.1 |
| 2002/0036675 A1 * | 3/2002 | Yoshihira et al. | 347/56 |

* cited by examiner

METHOD FOR MANUFACTURING LIQUID EJECTING HEAD

The entire disclosure of Japanese Patent Application No. 2006-296677, filed Oct. 31, 2006 is expressly incorporated by reference herein.

BACKGROUND

1. Technical Field

The present invention relates to a method for manufacturing a liquid ejecting head, and more particularly, relates to a method for manufacturing an ink jet recording head which discharges ink as a liquid.

2. Related Art

As an example of an ink jet recording head, which is a liquid ejecting head, there is a recording head including, a channel forming substrate that has a pressure generating chamber communicating with a nozzle orifice and a communicating portion communicating with the pressure generating chamber therein, a piezoelectric element mounted on a surface of the channel forming substrate, and a reservoir forming substrate that has a reservoir portion to be combined with the communicating portion of the channel forming substrate in order to form a part of a reservoir when bonded to the surface of the channel forming substrate having the piezoelectric element thereon. The reservoir mentioned above is constituted by the reservoir portion and the communicating portion which communicate with each other via a through hole portion that passes through a vibration plate and laminated films deposited on the vibration plate (see JP-A-2003-159801 or the like). In JP-A-2003-159801, specifically, a region, which faces the communicating portion, in the vibration plate and laminated films is mechanically punched to form a through hole portion so as to allow the reservoir portion to communicate with the communicating portion.

Mechanical cutting, however, may produce undesirable substances such as contaminant particles during a process of forming a through hole portion, so that the particles mix with ink in channels such as a pressure generating chamber causing problems such as defective ejection. After the formation of the through hole portion, for example, a cleaning process can remove the undesirable substances such as the contaminant particles to some extent, however, it is difficult to remove the particles completely. Furthermore, the mechanical cutting may induce crack formation near the through hole portion, which also may cause defective ejection. That is, if a crack is generated, the ejection from the nozzle orifice using such a reservoir filled with ink may peel off a broken piece from the cracked portion, and the peeled broken piece may clog the nozzle orifice so as to cause defective ejection.

In order to solve the above problems, there is provided a method including processes of removing a region of a vibration plate corresponding to a communicating portion before forming the communicating portion in a channel forming substrate so as to form a through hole portion, sealing the through hole portion with an adhesive layer and a metal layer (hereinafter, a separate metal layer) constituting a lead electrode extending from a piezoelectric element, forming a communicating portion by etching the sealed through hole portion, then removing the adhesive layer and the metal layer by wet etching so as to allow the communicating portion to communicate with the reservoir portion (see JP-A-2006-044083 or the like).

Using such a method for manufacturing the through hole portions such as the reservoir, which penetrates the channel forming substrate and a bonding substrate, the above-mentioned problems with choked nozzle orifices caused by contaminant substances can be avoided. Note here that, however, for example, if nickel-chrome (NiCr) is used as an adhesive layer in the case that gold (Au) is used as a metal layer, for example, an affected layer (a passive layer) may be formed on the surface of the adhesive layer (a separate metal layer) by exposure to an etchant used for etching the channel forming substrate. Once the affected layer is formed on the surface of the adhesive layer, it may be difficult to remove the adhesive layer in a subsequent wet etching process.

Furthermore, as the through hole portions that pass through the channel forming substrate and bonding substrate, there are provided not only the reservoir but also positioning holes that are used to position the channel forming substrate onto the nozzle plate having the nozzle orifice by inserting a positioning pin. The above-mentioned problems, however, may not occur in all adhesive layers disposed at their corresponding through hole portions.

Undoubtedly, such problems, which are found in the method for manufacturing an ink jet recording head for ejecting ink, may also be found in methods for manufacturing other liquid ejecting heads for ejecting liquid other than ink.

SUMMARY

An advantage of some aspects of the invention is to provide a method for manufacturing a liquid ejecting head, which can reliably remove an adhesive layer by wet etching, the adhesive layer constituting a separate metal layer sealing each through hole portion.

An aspect of the invention relates to a method for manufacturing a liquid ejecting head having a channel forming substrate, a bonding substrate, and a plurality of through hole portions, wherein the channel forming substrate has a pressure generating chamber communicating with a nozzle orifice ejecting liquid drops, and a piezoelectric element including a common electrode, a piezoelectric layer, and a discrete electrode on a surface thereof, the bonding substrate is bonded on the surface of the channel forming substrate having the piezoelectric element thereon, and the plurality of through hole portions pass through the bonding substrate and the channel forming substrate in the direction of the thickness, the method including forming piezoelectric elements on a vibration plate disposed on a surface of a channel forming wafer that will have a plurality of the channel forming substrates formed in one operation, and removing the vibration plate in regions that will become the through hole portions so as to form opening portions; forming lead electrodes extending from the piezoelectric elements and forming separate metal layers disconnected from the lead electrodes so as to be disposed on regions corresponding to the opening portions with the same material as the lead electrodes; attaching a bonding wafer to the surface of the channel forming wafer, wherein the bonding wafer includes a plurality of the bonding substrates formed in one operation and first through holes are formed in the bonding wafer in advance at regions corresponding to the through hole portions; forming second through holes in the channel forming wafer at regions corresponding to the through hole portions using wet etching from the opposite surface to the surface having the piezoelectric elements thereon, wherein the opening portions are sealed with the separate metal layers being electrically connected each other; communicating the first through holes with the second through holes to form the through hole portions by removing the separate metal layers using wet etching; and dividing the channel forming wafer bonded with the bonding wafer into the channel forming substrates bonded with the bonding substrates.

According to this embodiment, since all separate metal layers in the respective opening portions have the same electric potential, formation of an affected layer on surfaces of the metal layers can be prevented during an etching process for the channel forming substrates. Therefore, the metal layers can be successfully removed by wet etching so that the through hole portions can also be successfully formed.

Note here that a reservoir communicating with a plurality of the pressure generating chambers and storing the liquid to be supplied to each of the pressure generating chambers may be included as one of the through hole portions. In this case, ejection characteristics are improved because the reservoir, i.e., the through hole portion, is successfully formed so that the liquid can be supplied from the reservoir to each of the pressure generating chambers without problems.

Also, a positioning hole positioning a laminated substrate, in which the channel forming substrate and the bonding substrate are bonded to each other, onto a member mounted to the laminated substrate with a positioning pin inserted into the positioning hole may be included as one of the through hole portions. In this case, positioning hole is formed without problems so that each of members constituting the ejecting head can be positioned with high positional accuracy.

As an example for the above-mentioned members, there is a nozzle plate having a plurality of the nozzle orifices and bonded to the channel forming substrate. In this case, the channel forming substrate and the nozzle plate can be positioned with high positional accuracy.

Also, oblong slots constituting a breaking pattern provided around a region of each channel forming substrate of the channel forming wafer may be included as the through hole portions. In this case, the break pattern can be successfully formed so that the channel forming wafer and a protecting wafer can be securely diced along the breaking pattern.

Also, preferably each of the separate metal layers includes an adhesive layer and a metal layer disposed on the adhesive layer, and a hydrochloric peroxide mixture is used as an etchant to remove the adhesive layer. This ensures removal of the adhesive layer constituting the separate metal layer by an etching process.

Furthermore, preferably, each of the separate metal layers includes an adhesive layer and a metal layer disposed on the adhesive layer, and the second through holes are formed by etching of the channel forming wafer until the adhesive layer is exposed to the etchant. This can prevent the formation of an affected layer on the surface of the adhesive layer constituting the separate metal layer while forming the second through holes in the channel forming substrates with high accuracy.

Preferably, an aqueous potassium hydroxide solution is used as an etchant for etching the channel forming wafer. This can prevent the formation of an affected layer on the surface of the adhesive layer while forming the second through holes in the channel forming substrates with high accuracy.

Preferably, the material constituting the lead electrodes includes gold (Au) and nickel-chrome (NiCr). This can form the lead electrodes satisfactorily, and the separate metal layers can securely seal the opening portions.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will be described below in detail with reference to embodiments.

First Embodiment

Figure 1:
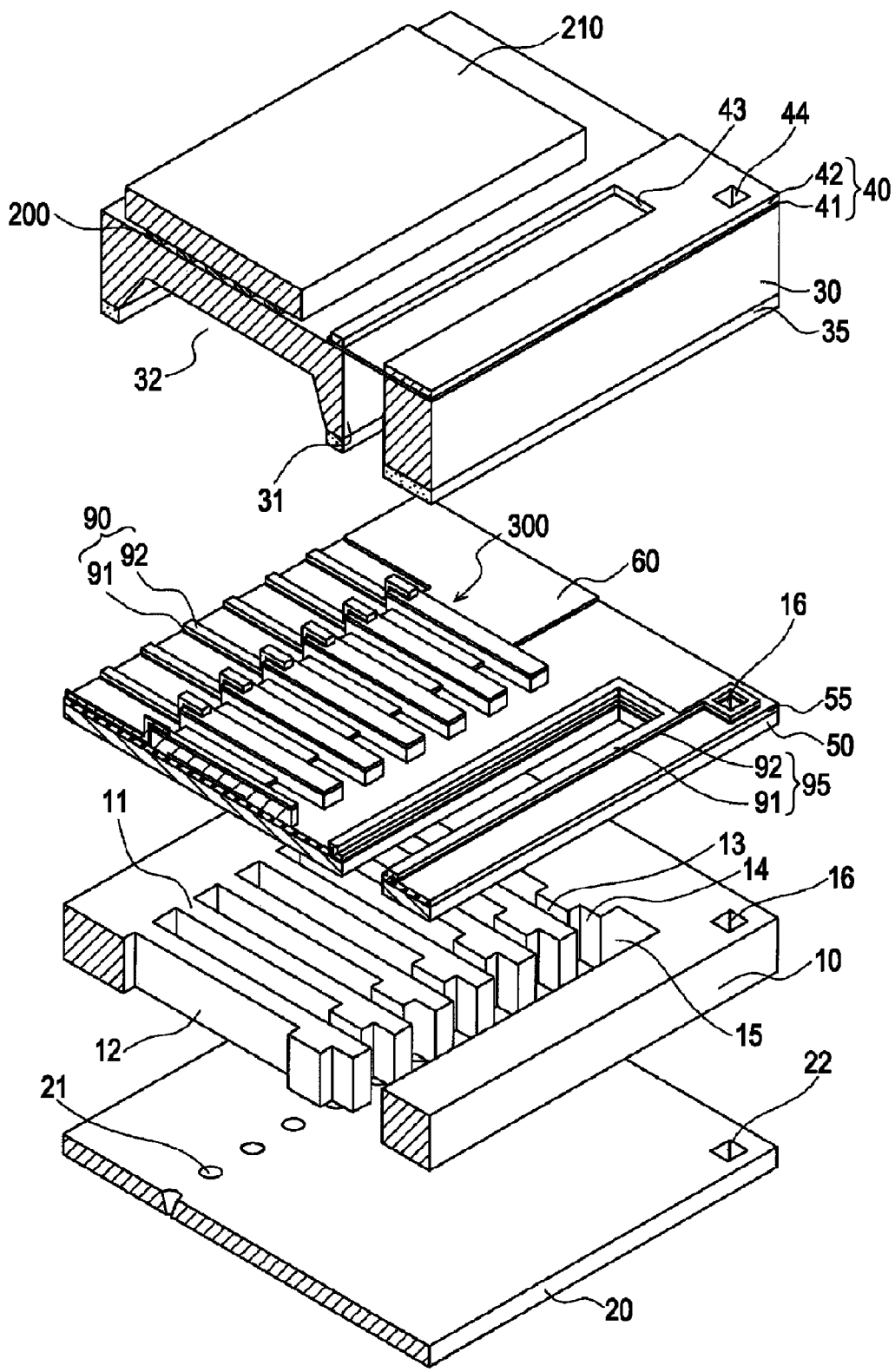
FIG. 1 is an exploded perspective view of a recording head according to a first embodiment.
Figure 2A:
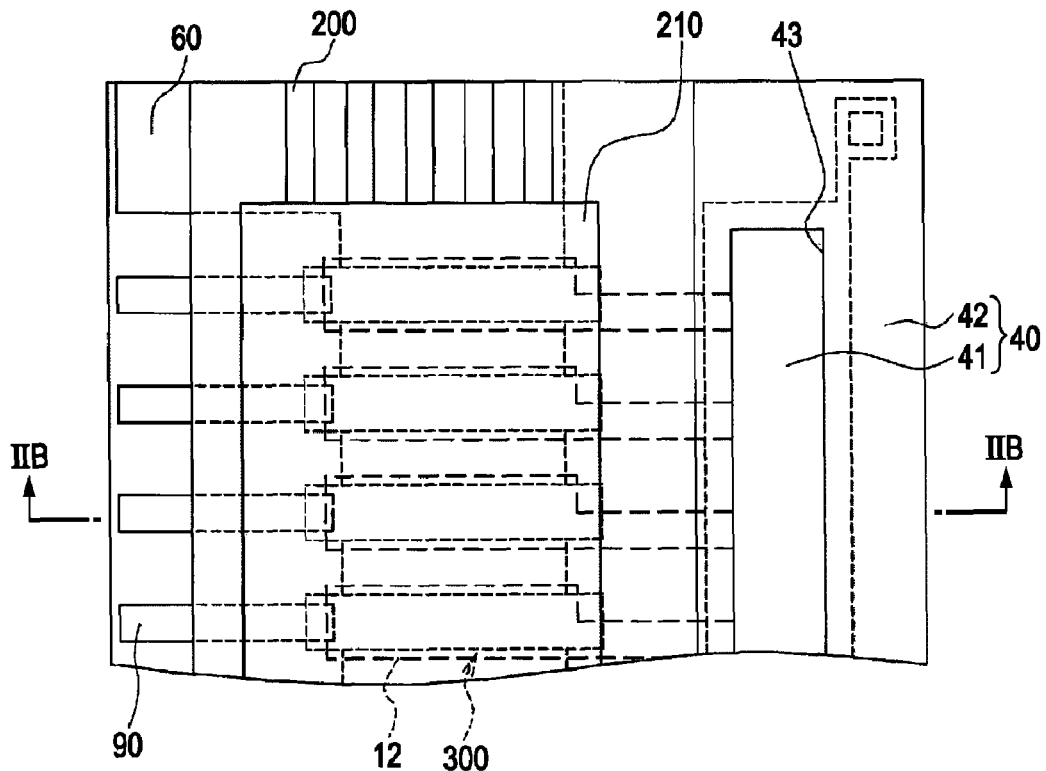
FIGS. 2A and 2B are a plan view and a sectional view, respectively, of the recording head according to the first embodiment.
Figure 2B:
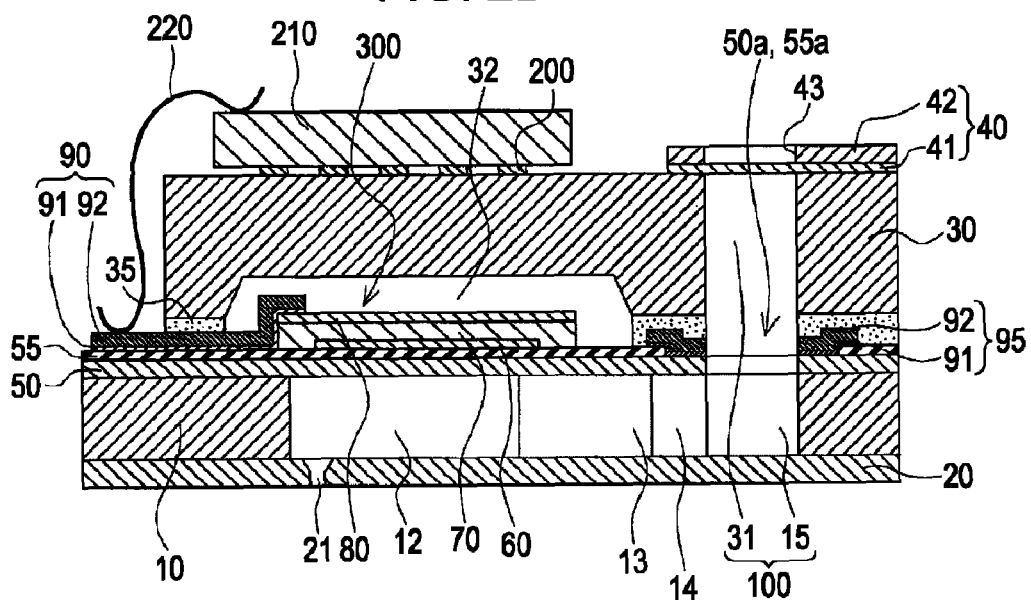

FIG. 1 is an exploded perspective view of an ink jet recording head manufactured by the method according to a first embodiment of the invention. FIGS. 2A and 2B are a plan view and a sectional view, respectively, of the ink jet recording head shown in FIG. 1. As shown in the drawings, a channel forming substrate 10 is composed of a monocrystalline silicon substrate oriented in a (110) plane. An elastic film 50 of silicon dioxide with a thickness of 0.5 to 2 µm is formed by thermal oxidation in advance on one of the surfaces of the channel forming substrate 10.

In the channel forming substrate 10, a plurality of pressure generating chambers 12 separated by partition walls 11 are arranged along a width direction of the chambers. At one longitudinal end of the pressure generating chambers 12 of the channel forming substrate 10, ink supply passages 13 and communicating passages 14 are formed, and are also separated by the partition walls 11 so that each passage can communicate with the corresponding pressure generating chambers 12. Further, a communicating portion 15 that can communicate with each of the communicating passages 14 is formed outside of the communicating passages 14. A reservoir forming substrate 30, which serves as a bonding substrate, is bonded on a surface of the elastic film 50 disposed on the channel forming substrate 10, which will be described in detail later. The communicating portion 15 communicates with a reservoir portion 31, which is a first through hole formed in the reservoir forming substrate 30, so as to constitute a part of a reservoir 100 that is a common ink chamber for each of the pressure generating chambers 12. Each of the ink supply passages 13 is formed so as to have a smaller sectional area in the width direction than that of each of the pressure generating chambers 12 and maintains the fluid resistance for in-coming ink liquid to be constant between the communicating portion 15 and the pressure generating chambers 12. For example, in this embodiment, the width of each of the ink supply passages 13 is made to be smaller than that of the pressure generating chambers 12. The communicating passages 14 are formed by extending the partition walls 11 of the pressure generating chambers 12 towards the communicating portion 15 so as to form spaces between the ink supply passages 13 and the communicating portion 15. Each of the communicating passages 14 is formed to have a larger width than that of the ink supply passages 13, for example, in this embodiment, the communicating passage 14 has a substantially the same width as that of the pressure generating chambers 12. That is, each of the communicating passages 14 has a larger sectional area in the width direction than that of each of the ink supply passages 13.

Furthermore, a plurality of positioning holes 16 are formed at the periphery of both the channel forming substrate 10 and the reservoir forming substrate 30. The positioning holes 16 passing through those substrates will be used to position a laminated substrate, which is composed of the channel forming substrate 10 and the reservoir forming substrate 30, on another member (for example, a nozzle plate 20, which will be mentioned later) that is to be bonded to the laminated substrate. A positioning pin is inserted into each positioning hole at a positioning process. Details of the positioning process will be described later.

Figure 3:
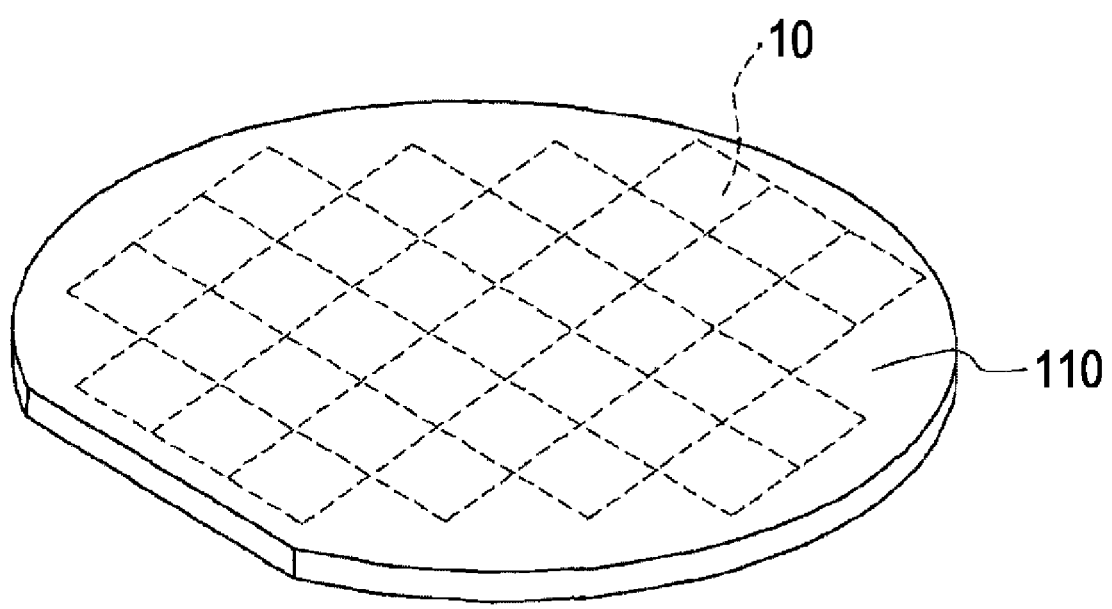
FIG. 3 is a perspective schematic view of a wafer for channel forming substrates.

As shown in FIG. 3, the pattern for the channel forming substrate 10 is formed a plurality of times in one operation in a channel forming wafer 110 that is made of a silicon monocrystalline substrate to form a plurality of the channel forming substrates 10. The pressure generating chambers 12 and the like are formed in the channel forming wafer 110, and then the channel forming wafer 110 is diced so as to separate the channel forming substrates 10.

A nozzle plate 20 is fixed on the open surface side of the channel forming substrate 10 using an adhesive or a thermal welding film, or the like. The nozzle plate 20 has nozzle orifices 21 that are formed to communicate with the pressure generating chambers 12 at end portions of the chambers opposing the ink supply passages 13. The nozzle plate 20 also has a positioning hole 22 at a position corresponding to the positioning hole 16 of the channel forming substrate 10. The nozzle plate 20 is composed of, for example, glass ceramic, a silicon monocrystalline substrate, stainless steel, or the like.

On a side opposite to the open surface side of the channel forming substrate 10, the elastic film 50 having a thickness of, for example, about 1.0 μm is formed as mentioned above, and an insulating film 55 having a thickness of, for example, about 0.4 μm is formed on the elastic film 50. Further, a lower electrode film 60 having a thickness of, for example, about 0.2 μm, a piezoelectric layer 70 having a thickness of, for example, about 1.0 μm, and an upper electrode film 80 having a thickness of, for example, about 0.05 μm are laminated on the insulating film 55 so as to form a piezoelectric element 300. Note that the term "piezoelectric element 300" here refers to a portion including the lower electrode film 60, the piezoelectric layer 70 and the upper electrode film 80. Usually, one of the electrodes of each of a plurality of the piezoelectric elements 300 serves as a common electrode, and the other electrode and the piezoelectric layer 70 are patterned to be the respective pressure generating chambers 12. In this embodiment, the lower electrode film 60 serves as a common electrode of the piezoelectric elements 300 and the upper electrode film 80 serves as a discrete electrode of the piezoelectric elements 300. The electrodes can be replaced with each other considering the positions of a driving circuit or wiring.

A lead electrode 90 extends from each of the upper electrode films 80 of the piezoelectric elements 300. A voltage can be applied selectively to each of the piezoelectric elements 300 through the lead electrode 90. The lead electrode 90 is composed of an adhesive layer 91 made of nickel-chrome (NiCr), and a metal layer 92 made of gold (Au) or the like formed on the adhesive layer 91. A separate metal layer 95 that has the same layer structure as the lead electrode 90, which has the adhesive layer 91 and the metal layer 92, remains in a separated condition in a region corresponding to a periphery of the communicating portion 15 on the insulating film 55 formed on the elastic film 50, which will be described in detail later. In the same way, the separate metal layer 95 remains around the positioning hole 16 in a region (see FIG. 1).

A reservoir forming substrate 30 having a reservoir portion 31, which constitutes at least a part of a reservoir 100, is bonded on the piezoelectric elements 300 side of the channel forming substrate 10 using a adhesive layer 35 composed of, for example, an epoxy adhesive agent. The reservoir portion 31 of the reservoir forming substrate 30 communicates with the communicating portion 15 via opening portions 50a and 55a formed in the elastic film 50 and the insulating film 55, respectively, so that the reservoir 100 is formed with the reservoir portion 31 and the communicating portion 15. Unlike the communicating portion 15 shown in FIG. 1 that is formed as a common portion, a plurality of the communicating portions 15 may be formed to connect individually to the pressure generating chambers 12. In this case, only the reservoir portion 31 serves as the reservoir 100 in the reservoir forming substrate 30.

A piezoelectric element chamber 32 is formed at the region opposing the piezoelectric elements 300 in the reservoir forming substrate 30. Since the piezoelectric elements 300 are disposed in the piezoelectric element chamber 32, the elements are protected and scarcely influenced by the external environment. The piezoelectric element chamber 32 may be sealed or not sealed. As the materials for the reservoir forming substrate 30, for example, glass, ceramic materials, metal, and resin are used. Preferably, the reservoir forming substrate 30 is composed of a material having substantially the same coefficient of thermal expansion as the channel forming substrate 10. In this embodiment, a silicon monocrystalline substrate, which is composed of the same material as that of the reservoir forming substrate 30, is used for the channel forming substrate 10.

Connecting wirings 200 having predetermined patterns are formed on the reservoir forming substrate 30. Further, a driving IC 210 is mounted on the connecting wirings 200 for driving the piezoelectric elements 300. The end portions of the lead electrodes 90 extracted from the piezoelectric elements 300 towards the outside of the piezoelectric element chamber 32 are electrically connected to the driving IC 210 via the driving wirings 220.

Furthermore, a compliance substrate 40 that is composed of a sealing film 41 and a fixing plate 42 is bonded on the region of the reservoir forming substrate 30 corresponding to the reservoir portion 31. The sealing film 41 is made of a material having flexibility and low rigidity (for example, a polyphenylene sulfide (PPS) film of 6 μm in thickness) and one side of the reservoir portion 31 is sealed using the sealing film 41. Further, the fixing plate 42 is made of a hard material such as a metal (for example, stainless steel (SUS) of 30 μm in thickness). The fixing plate 42 in the region corresponding to the reservoir 100 is completely removed so as to form an opening 43. Therefore, the reservoir 100 is sealed with the flexible sealing film 41 alone. Furthermore, the compliance substrate 40 also has a positioning hole 44 corresponding to the positioning hole 16 formed on the reservoir forming substrate 30.

In an ink head recording head according to this embodiment, ink is ejected from the nozzle orifice 21 by taking ink from an external ink supply unit (not shown), filling an interior portion that extends from the reservoir 100 to the nozzle orifice 21, applying voltage between the lower electrode film 60 and the upper electrode film 80 corresponding to each of the pressure generating chambers 12 on the basis of a record signal from the driving IC 210, and deforming the piezoelectric elements 300 to deflect a vibration plate so that the internal pressure of each of the pressure generating chambers 12 can be increased.

Figure 7A:
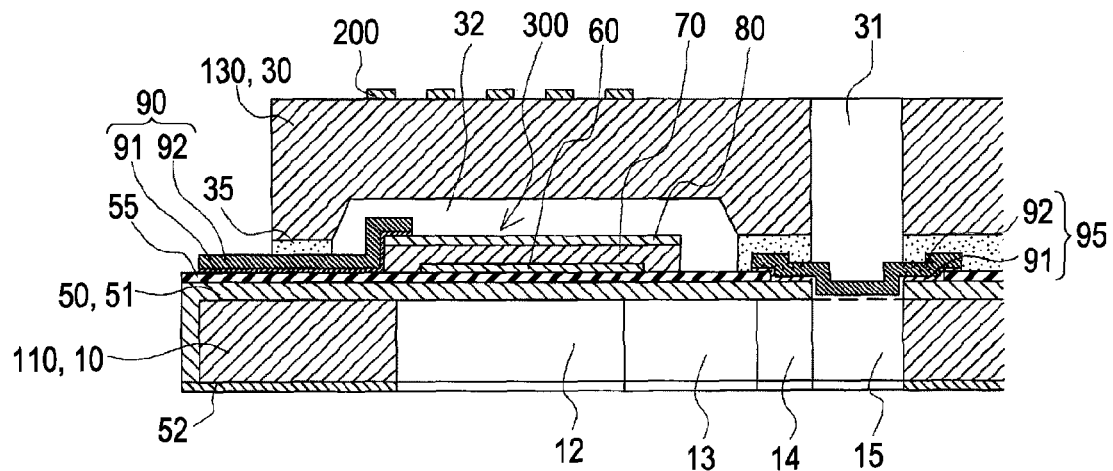
FIGS. 7A and 7B are sectional views showing a process for manufacturing the recording head according to the first embodiment.
Figure 8:
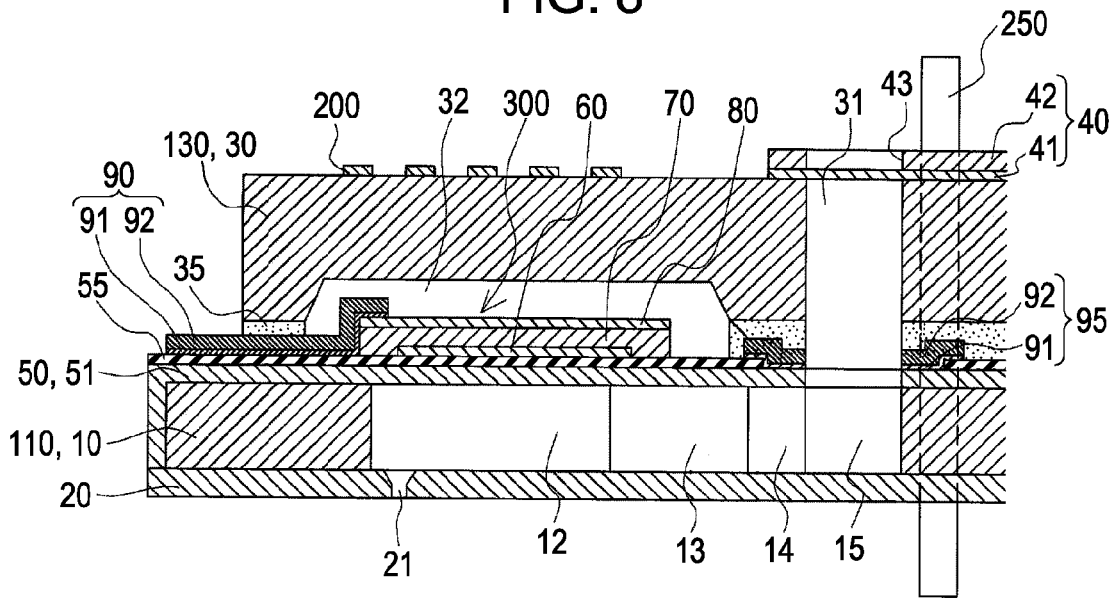
FIG. 8 is a sectional view showing a process for manufacturing the recording head according to the first embodiment.
Figure 9:
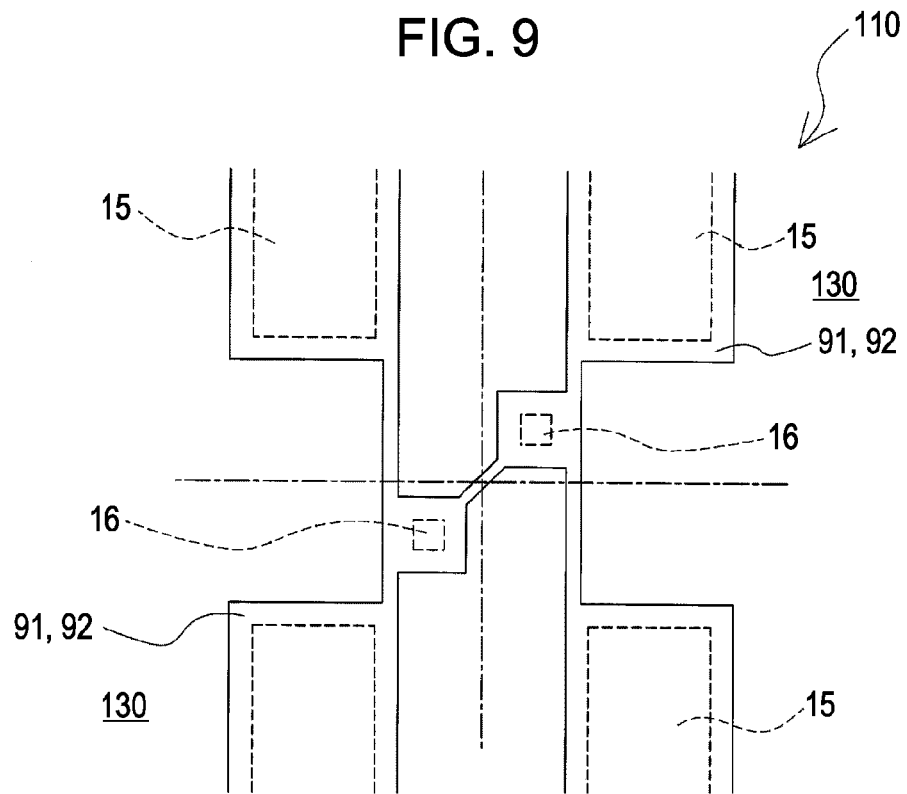
FIG. 9 is an enlarged plan view showing a part of the wafer for the channel forming substrate.

Now, a method for manufacturing such an ink jet recording head will be described with reference to FIGS. 4A to 9. FIGS. 4A to 8 are longitudinal sectional views of a pressure generating chamber of a wafer for channel forming substrates. FIG. 9 is an enlarged plan view showing a part of a wafer for channel forming substrates.

Figure 4A:
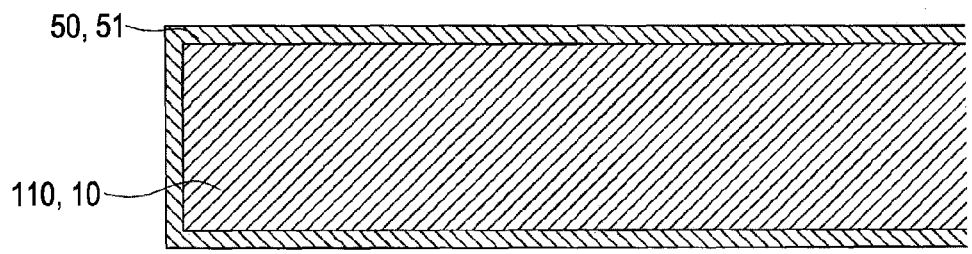
FIGS. 4A to 4D are sectional views showing a process for manufacturing the recording head according to the first embodiment.
Figure 4B:
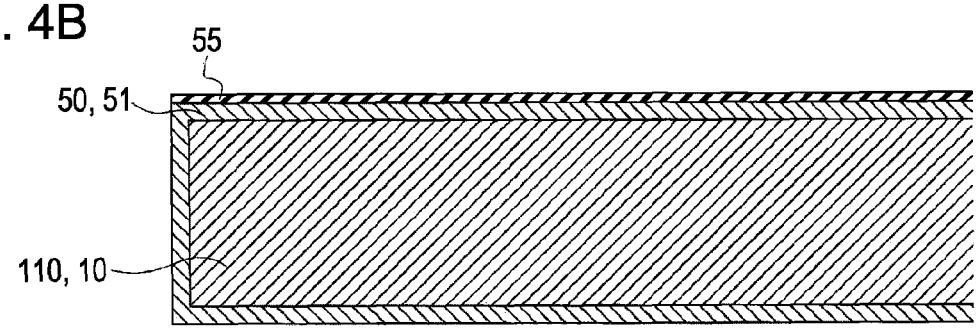

First, as shown in FIG. 4A, a channel forming wafer 110, which is a silicon wafer provided to form a plurality of channel forming substrates 10 thereon in one operation, is subjected to thermal oxidation at a temperature of about 1100° C. in a diffusion furnace to form a silicon dioxide film 51 serving as an elastic film 50 on the surface of the channel forming wafer 110. Next, as shown in FIG. 4B, an insulating film 55 made of zirconium oxide is formed on the elastic film 50 (silicon dioxide film 51). Specifically, a zirconium (Zr) layer is deposited on the elastic film 50 (silicon dioxide film 51) by sputtering or the like, then the zirconium layer undergoes thermal oxidation at a temperature of, for example, 500° C. to 1200° C. in a diffusion furnace to form an insulating layer 55 made of zirconium oxide ($ZrO_2$). The elastic film 50 and the insulating film 55 serve as a vibration plate.

Figure 4C:
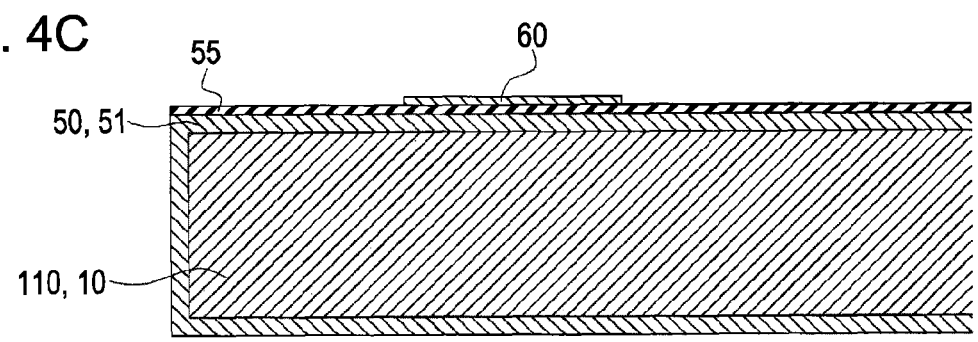
Figure 4D:
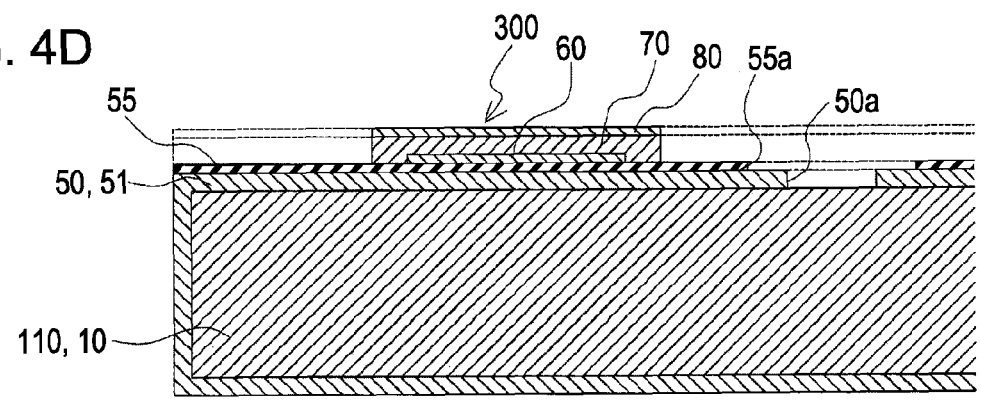

Next, as shown in FIG. 4C, a lower electrode film 60 is formed, for example, by depositing platinum and iridium on the insulating film 55. Then, the lower electrode film 60 is formed into a predetermined pattern. Next, as shown in FIG. 4D, a piezoelectric layer 70 made of, for example, lead zirconate titanate (PZT), and an upper electrode film 80 made of iridium is deposited on the entire surface of the channel forming wafer 110. Then, the piezoelectric layer 70 and the upper electrode film 80 are patterned into piezoelectric elements 300 on the respective regions corresponding to the pressure generating chambers 12. Further, after the formation of the piezoelectric elements 300, the insulating film 55 and the elastic film 50 are formed into a predetermined pattern so that regions, which will be communicating portions in the channel forming wafer 110, of the insulating film 55 and the elastic film 50 can be removed. The insulating film 55 is etched to form opening portions 55a, and then the elastic film 50 is etched to form opening portions 50a. The opening portions 50a and 55a will also be formed at the region where a positioning hole 16 is to be formed (not shown). Furthermore, in the present embodiment, the opening area of the openings 55a of the insulating film 55 is set to be larger than that of the openings 50a of the elastic film 50. Of course, the size of the openings 50a may be the same as that of the openings 55a.

Figure 5A:
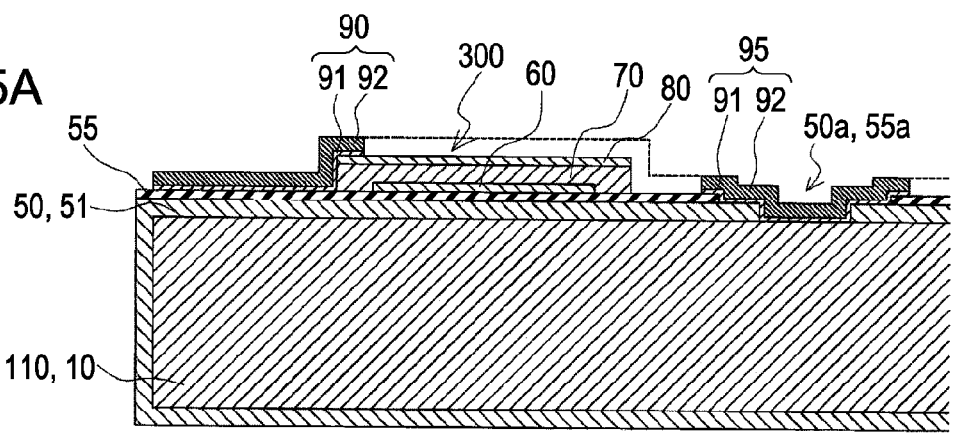
FIGS. 5A to 5C are sectional views showing a process for manufacturing the recording head according to the first embodiment.

Next, as shown in FIG. 5A, the lead electrode 90 is formed. Specifically, an adhesive layer 91 made of nickel-chrome (NiCr) is deposited on the entire surface of the channel forming wafer 110. Then, a metal layer 92, for example, made of gold (Au) is deposited on the adhesive layer 91. Next, the metal layer 92 and the adhesive layer 91 are formed into the lead electrode 90 of each of the piezoelectric elements 300 through a patterning process using a mask pattern (not shown) made of a resist material or the like applied on the metal layer 92.

In this patterning process, the regions in the adhesive layer 91 and the metal layer 92, which correspond to the opening portions 50a and 55a, are left so as to be separated from the lead electrode 90. That is, the separate metal layer 95 including the adhesive layer 91 and the metal layer 92 is formed on at least a part of a region facing the opening portions 50a and 55a. Thus, the separate metal layer 95 seals the opening portions 50a and 55a. Further, in the present embodiment, the adhesive layers 91 of the separate metal layers 95, which seal the corresponding opening portions 50a and 55a each provided corresponding to a communicating portion 15 and a positioning hole 16, are electrically connected to each other. In this embodiment, as shown in FIG. 9, the adhesive layer 91 and metal layer 92 constituting the separate metal layer 95 are formed into a pattern such that the individual regions facing the opening portions 50a and 55a are connected to each other. Of course, the separate metal layers 95 in the individual regions corresponding to the opening portions 50a and 55a may be electrically connected to a common wiring pattern that is newly added or the like.

Although, all patterns of the separate metal layers 95 formed on the channel forming wafer 110 are electrically connected in the present embodiment, electrical connection among parts of the separate metal layers 95 on the channel forming wafer 110 may be available. For example, the separate metal layers 95 corresponding to the channel forming substrates 10 arranged in a line on the channel forming wafer 110, may be electrically connected to each other. Each of the separate metal layers 95, which corresponds to one of the channel forming substrates 10, needs at least one electrical connection. Note that, in the process described later, these separate metal layers 95 prevent an etched region from being overetched during the formation process of the pressure generating chambers 12 and the communicating portions 15, and the like.

Figure 5B:
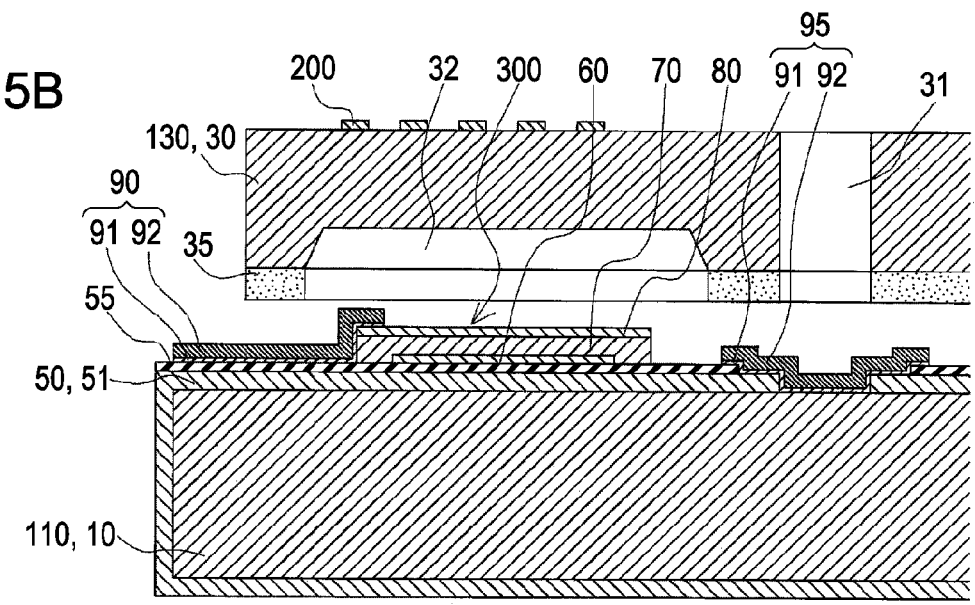

Next, as shown in FIG. 5B, a reservoir forming wafer 130, which has a plurality of reservoir forming substrates 30 formed simultaneously therein, is bonded using a bonding layer 35, composed of an epoxy adhesive agent or the like, on the channel forming wafer 110. In the reservoir forming wafer 130, the reservoir portions 31, the piezoelectric element chambers 32, and the like are formed in advance, and on the wafer 130, the connecting wirings 200 are formed in advance.

Figure 5C:
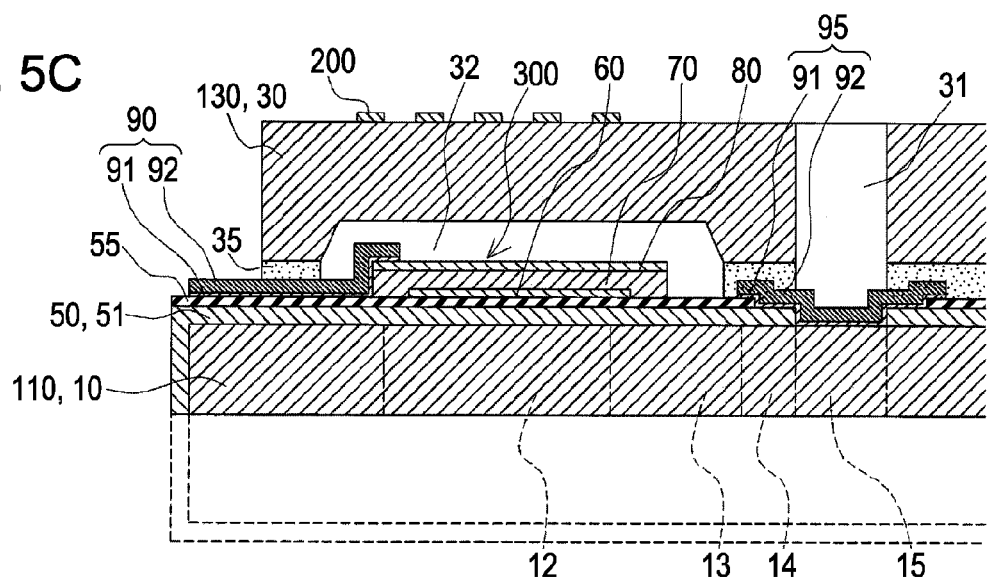
Figure 6A:
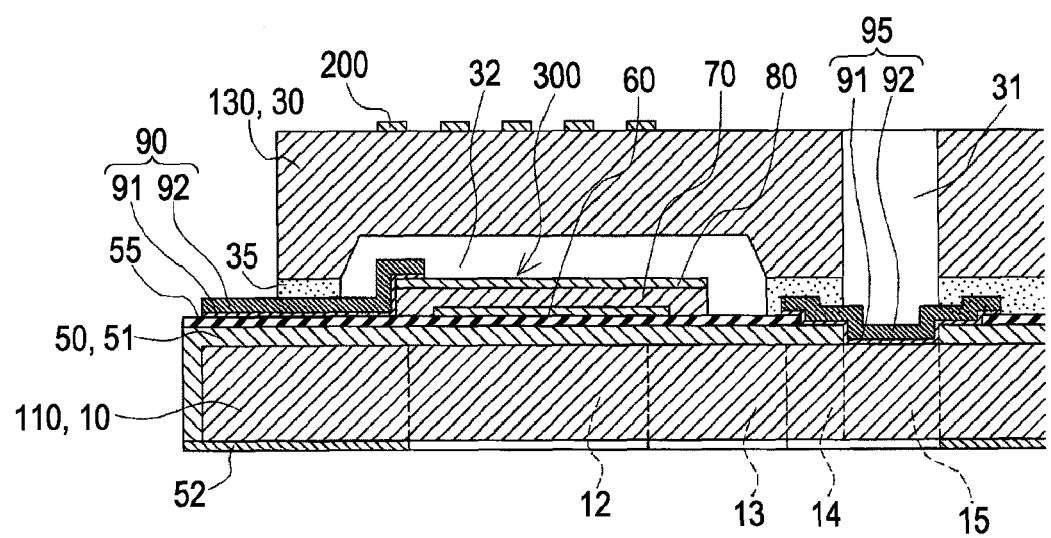
FIGS. 6A and 6B are sectional views showing a process for manufacturing the recording head according to the first embodiment.

Next, as shown in FIG. 5C, the channel forming wafer 110 undergoes a wafer thinning process so as to have a desired thickness. Then, as shown in FIG. 6A, for example, a protection film 52 is newly deposited and formed into a predetermined pattern.

Figure 6B:
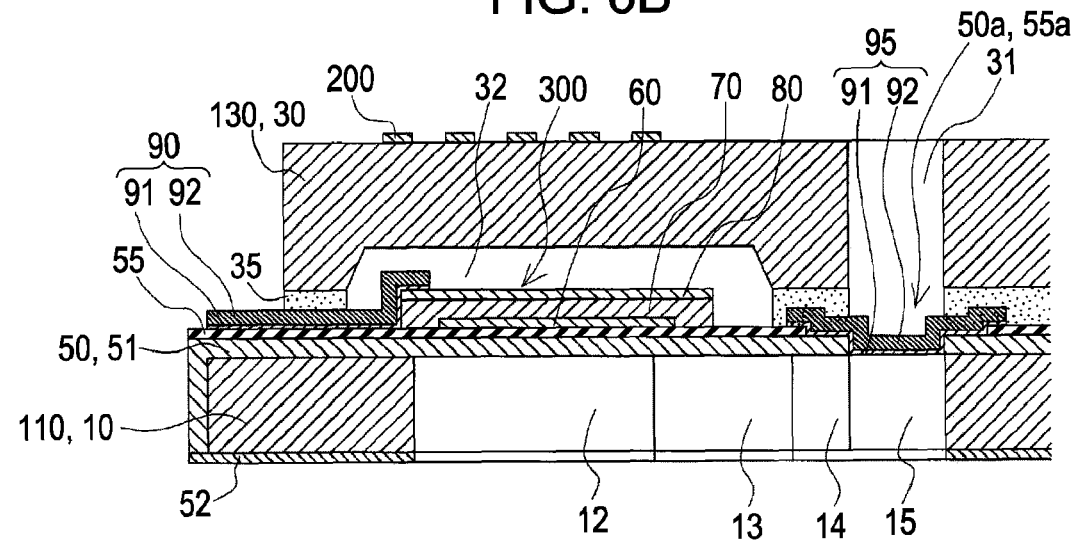

As shown in FIG. 6B, the pressure generating chamber 12, the ink supply passage 13, the communicating passage 14, the communicating portion 15, and the positioning hole 16 are formed in the channel forming wafer 110 by anisotropic etching (wet etching). The protection film 52 serves as a mask when the channel forming wafer 110 is etched. That is, the channel forming wafer 110 having the opening portions 50a and 55a sealed with the separate metal layer 95, is etched using an etchant, for example, an aqueous potassium hydroxide (KOH) solution. Then, the etching is performed until the elastic film 50 and the separate metal layer 95 are exposed, resulting in the simultaneous formation of the pressure generating chamber 12, the communicating portion 15, and the like.

At this process, since the opening portions 50a and 55a are sealed with the separate metal layer 95 composed of the adhesive layer 91 and the metal layer 92, the etchant cannot flow into the side of the reservoir forming wafer 130 through the opening portions 50a and 55a. Therefore, failures such as wire breakage can be prevented because connecting wirings 200 formed on the surface of the reservoir forming wafer 130 are not exposed to the etchant. Also, undesired etching of the reservoir forming wafer 130 can be prevented because the etchant does not enter the reservoir portion 31.

Furthermore, as already mentioned, since the separate metal layer 95 facing the opening portions 50a and 55a enables electrical connection thereof, an affected layer (passive layer), the properties of which are changed by the etchant, cannot be formed on the adhesive layer 91 of the separate metal layer 95 that seals the opening portions 50a and 55a during the wet etching of the channel forming wafer 110. The separate metal layer 95 does not have any affected layer regardless of where the separate metal layer is disposed in a wafer, because all regions of the separate metal layer 95 facing respective opening portions 50a and 55a have the same electric potential. Note that, although the affected layer formed on the outer surface of the adhesive layer 91 is extremely thin, an etchant for etching the adhesive layer 91 cannot remove the affected layer.

When the method of the invention is used, the formation of the affected layer is prevented on the outer surface of the adhesive layer 91, which constitutes the separate metal layer 95. Therefore, at the subsequent process, the adhesive layer 91 constituting the separate metal layer 95 is successfully removed. Specifically, an etching process of the adhesive layer 91 using an etchant such as a hydrochloric peroxide mixture, that is, an "SC2 treatment (SC2 cleaning)" of the adhesive layer 91, can successfully remove the adhesive layer 91 facing the opening portions 50a and 55a as shown in FIG. 7A.

Figure 7B:
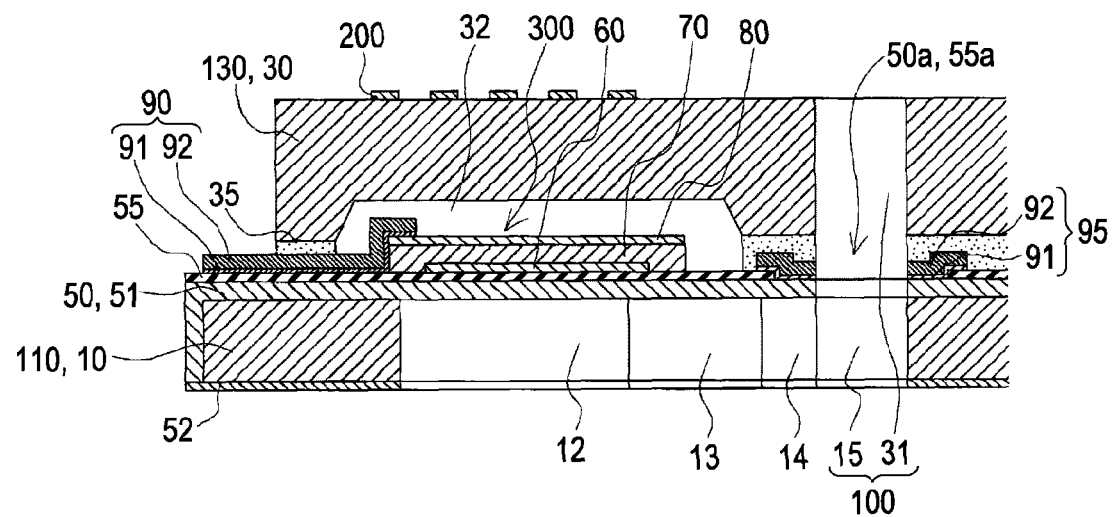

Then, a region of the metal layer 92 facing the opening portions 50a and 55a is completely removed as shown in FIG. 7B by wet etching of the metal layer 92 from the side of the channel forming substrate 10. By this etching process, the communicating portion 15, namely, a second through hole, and the reservoir portion 31, namely, a first through hole, are connected via the opening portions 50a and 55a to become the reservoir 100, namely, the through hole portion. The positioning hole 16, which is a through hole portion (not shown), is also formed at the same etching process.

After the formation of the reservoir 100, which is the through hole portion and etched by the above-mentioned process, a driving IC 210 is mounted on connecting wirings 200 formed on the reservoir forming wafer 130. Then, the driving IC 210 is connected to the lead electrodes 90 with the driving wirings 220. The peripheries of the channel forming wafer 110 and the reservoir forming wafer 130, which are not needed, are cut off using a dicing process or the like.

A nozzle plate 20 having a nozzle orifices 21 is bonded on the surface of the channel forming wafer 110 that has the reservoir forming wafer 130 on the other side thereof. A compliance substrate 40 is also bonded on the reservoir forming wafer 130. In this bonding process, as shown in FIG. 8, a positioning pin 250 is inserted into the positioning hole 16 of the channel forming substrate 10, the positioning hole 16 of the reservoir forming substrate 30, the positioning hole 22 of the nozzle plate 20, and the positioning hole 44 of the compliance substrate 40. Thereby, all members can be bonded together with high positional accuracy. Then, the channel forming wafer 110 bonded on the reservoir forming wafer 130 and the like is diced so as to form the channel forming substrates 10. Each of the channel forming substrate 10 having the geometry shown in FIG. 1 is the ink jet recording head with the above-mentioned structure.

Figure 10:
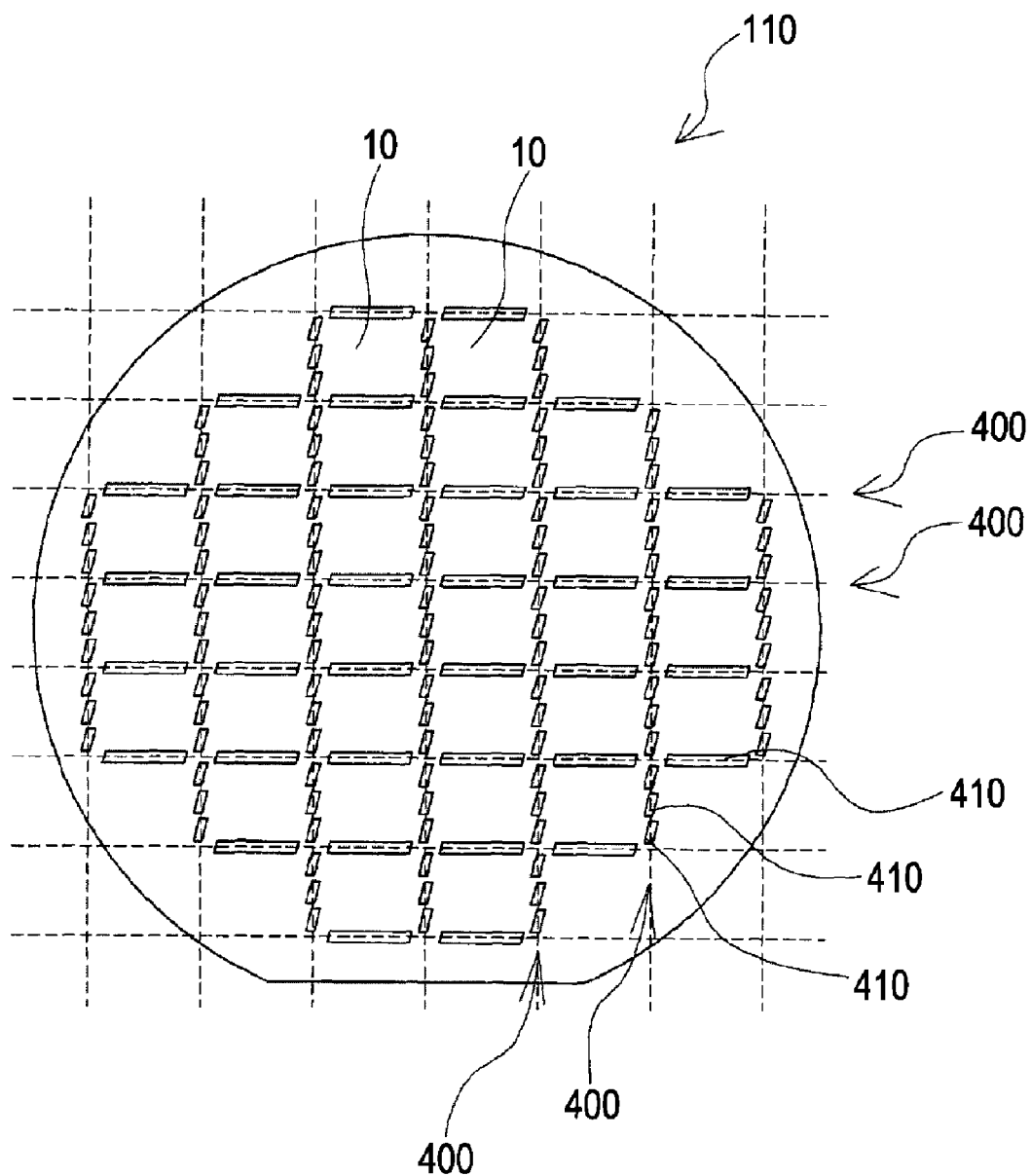
FIG. 10 is a schematic plan view of the wafer for the channel forming substrates.

Note here that, practically, breaking patterns 400 composed of a plurality of oblong slots 410 are formed as shown in FIG. 10. The oblong slots are arranged at desired intervals between chips of the substrate on the channel forming wafer 110 and the reservoir forming wafer 130. Each of the chips on the channel forming wafer 110 bonded on the reservoir forming wafer 130 is divided by the breaking patterns 400. The oblong slots 410 constituting the breaking patterns 400 can also be formed by the same process as that used for the positioning hole 16 of the reservoir 100. In this case, the separate metal layer 95 is disposed on the region where the oblong slots 410 will be formed before the process of etching the channel forming wafer 110 is performed.

In the present embodiment, the separate metal layers 95 corresponding to the regions of the reservoir 100 and the positioning hole 16 are electrically connected. Further, the separate metal layer 95 corresponding to the region of the oblong slots 410, which constitute the breaking patterns 400, may be electrically connected to the above-mentioned separate metal layer. This can securely prevent the formation of an affected layer on an adhesive layer 91 constituting the separate metal layer 95 because larger area of the separate metal layer 95 has a uniform electric potential.

Other Embodiments

While the first embodiment of the invention has been described, the invention is not limited to this embodiment. For example, although a reservoir forming substrate having reservoir portions is described as an example of a bonding substrate in the first embodiment, the bonding substrate is not particularly limited as long as the substrate has a first through hole that communicates with a second through hole formed in a channel forming substrate 10. More specifically, while a reservoir, a positioning hole, and an oblong slit are described as examples of the through hole portion in the first embodiment, the through hole portion is not limited to those examples as long as the through hole portion is composed of a second through hole passing through the channel forming substrate and a first through hole passing through the bonding substrate.

An ink protection film composed of a material such as tantalum oxide that has a resistance to ink may also be provided on inner surfaces of the pressure generating chamber, reservoir, etc. Although an opening portion is formed after the formation of a piezoelectric element in the above-mentioned embodiment, the opening portion can be formed before the formation of the piezoelectric elements 300.

Although the description has been made with reference to the ink jet recording head, which is an example of a liquid ejecting head in the above-mentioned embodiments, the invention can be widely applied to all kinds of liquid ejecting heads. Therefore, it can be applied to a method for manufacturing liquid ejecting heads that eject liquids other than ink. Other examples of the liquid ejecting heads include recording heads for image recording devices such as a printer, coloring material ejecting heads used in the manufacturing process for color filters for liquid crystal displays, electrode material ejecting heads for forming electrodes such as those used in an organic electroluminescence (EL) display or a field emission display (FED), bioorganic material ejecting heads used in the manufacturing process for bio-chips, and the like.

What is claimed is:

1. A method for manufacturing a liquid ejecting head comprising a channel forming substrate and a reservoir forming substrate, the method comprising:
    forming a vibration plate on the channel forming substrate;

forming a piezoelectric element on the vibration plate;

removing portions of the vibration plate in order to form a first opening portion and a second opening portion;

forming a lead electrode extending from the piezoelectric element, a first separate metal layer disposed over the first opening portion and a second separate metal layer disposed over the second opening portion, the separate metal layers being disconnected from the lead electrode;

attaching a reservoir forming substrate to the one surface of the channel forming substrate;

forming a communicating portion including forming a first positioning hole in a region where the first opening portion is formed in the channel forming substrate and forming a second positioning hole in a region where the second opening portion is formed in the channel forming substrate; and communicating the reservoir portion with the communicating portion and communicating the first positioning hole with the second positioning hole by removing the separate metal layers in a wet etching process;

wherein the first separate metal layer and the second separate metal layer are electrically connected.

2. The method for manufacturing a liquid ejecting head according to claim 1, wherein the vibration plate includes an elastic film made of silicon dioxide and an insulating film made of zirconium oxide.

3. The method for manufacturing a liquid ejecting head according to claim 1, wherein the piezoelectric element includes a lower electrode film, a piezoelectric layer, and an upper electrode film.

4. The method for manufacturing a liquid ejecting head according to claim 1, wherein the lead electrode includes an adhesive layer made of nickel-chrome.

5. The method for manufacturing a liquid ejecting head according to claim 4, wherein the lead electrode further includes a metal layer made of gold.

6. The method for manufacturing a liquid ejecting head according to claim 1, wherein the separate metal layers consist of the same material as the lead electrode.

7. The method for manufacturing a liquid ejecting head according to claim 1, wherein the first positioning hole and the second positioning hole are used to position the channel forming substrate by inserting a positioning pin.

8. The method for manufacturing a liquid ejecting head according to claim 1, wherein a communicating portion and a second positioning hole are formed by a wet etching, and an aqueous potassium hydroxide solution is used as an etchant for etching the channel forming substrate.

9. The method for manufacturing a liquid ejecting head according to claim 1, wherein a hydrochloric peroxide mixture is used as an etchant to remove the separate metal layers.

* * * * *